United States Patent [19]
Nakamura et al.

[11] Patent Number: 5,438,211
[45] Date of Patent: Aug. 1, 1995

[54] CHARGE-TRANSFER DEVICE HAVING AN IMPROVED CHARGE-SENSING SECTION

[75] Inventors: Nobuo Nakamura, Sagamihara; Yoshiyuki Matsunaga, Kamakura; Yoshihito Koya, Kawasaki; Yukio Endo, Yokohama, all of Japan

[73] Assignee: Kabushiki Kaisha Toshiba, Kawasaki, Japan

[21] Appl. No.: 220,708

[22] Filed: Mar. 31, 1994

[30] Foreign Application Priority Data

Mar. 31, 1993 [JP] Japan ................................ 5-074838

[51] Int. Cl.⁶ ............................................. H01L 29/78
[52] U.S. Cl. ................... 257/239; 257/223; 257/229; 257/230; 257/249
[58] Field of Search ............... 257/223, 229, 230, 239, 257/249

[56] References Cited

U.S. PATENT DOCUMENTS 4,984,045 1/1991 Matsunaga .

OTHER PUBLICATIONS

W. F. Kosonocky, J. E. Carnes, "Basic Concepts of Charge–Coupled Devices", RCA Review, vol. 36, p. 566, Sep. 1975.
R. J. Brewer, "A Low Noise CCD Output Amplifier", IEDM Dig. Tech. Papers. 1978, pp. 610–612.

*Primary Examiner*—Ngân V. Ngô
*Attorney, Agent, or Firm*—Oblon, Spivak, McClelland, Maier, & Neustadt

[57] ABSTRACT

A charge-transfer device contains a high-resistance p-well layer formed in the surface of an n-type semiconductor substrate. In the surface of the well layer, a charge-transfer n-channel layer, a charge storage n-channel layer, a charge release n-channel layer, and a charge release n-type drain are formed continuously. An output gate electrode is provided above the junction of the transfer channel layer and the storage channel layer, with an insulating film interposed therebetween. Provided above the release channel layer is a reset gate electrode with an insulating film interposed therebetween. In the surface of the storage channel layer, a charge-sensing p-channel layer of a charge-sensing transistor is formed. The charge-sensing channel layer is arranged so as to be in contact with neither the transfer channel layer nor the release channel layer. The storage channel layer is arranged so as to contain a first surface portion which adjoins the transfer channel layer and is in contact with a covering insulating film, and a second surface portion which adjoins the release channel layer and is in contact with the covering insulating film. In the surface of the substrate, a p-type source and drain layers of the charge-sensing transistor are formed so as to face each other with the sensing channel interposed therebetween. The potential of the storage channel layer without charges is set higher than that of the release drain layer.

20 Claims, 12 Drawing Sheets

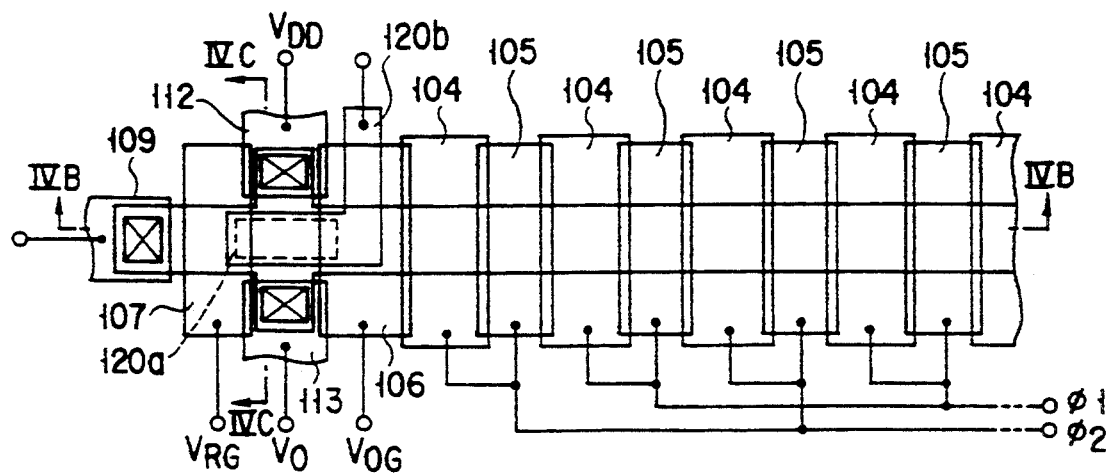
F I G. 4A
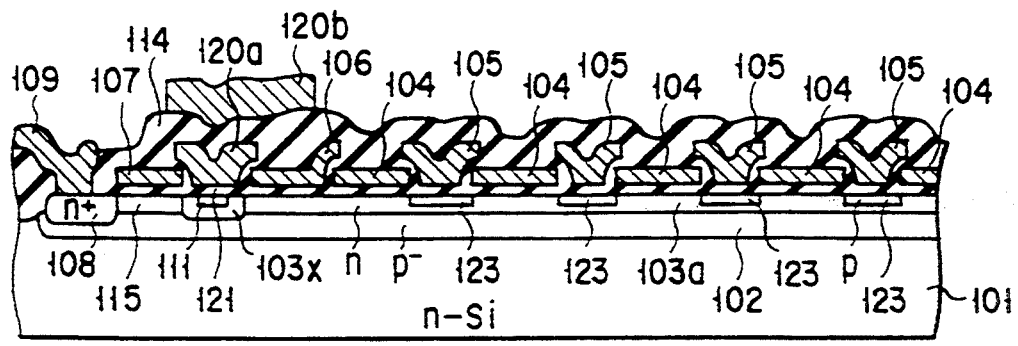
F I G. 4B
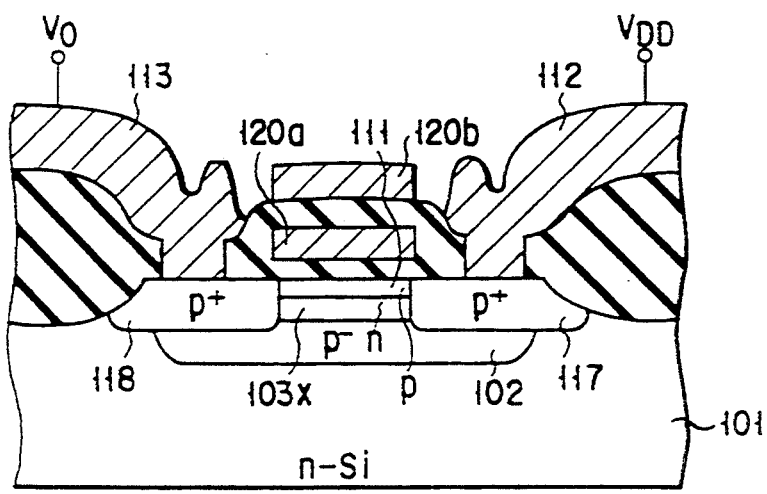
F I G. 4C

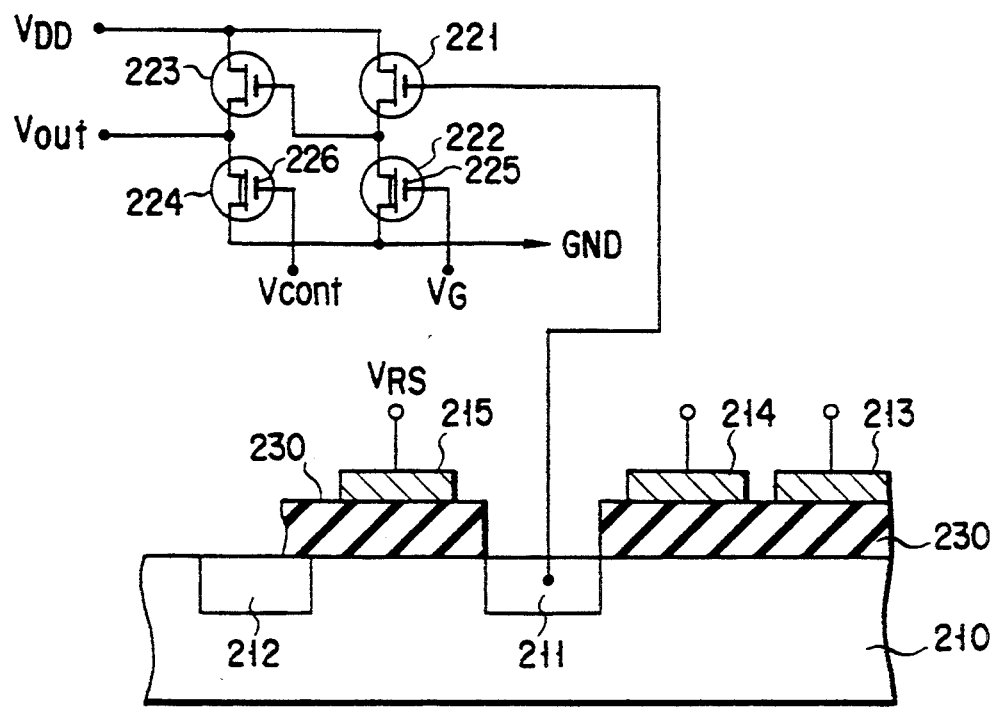
F I G. 10
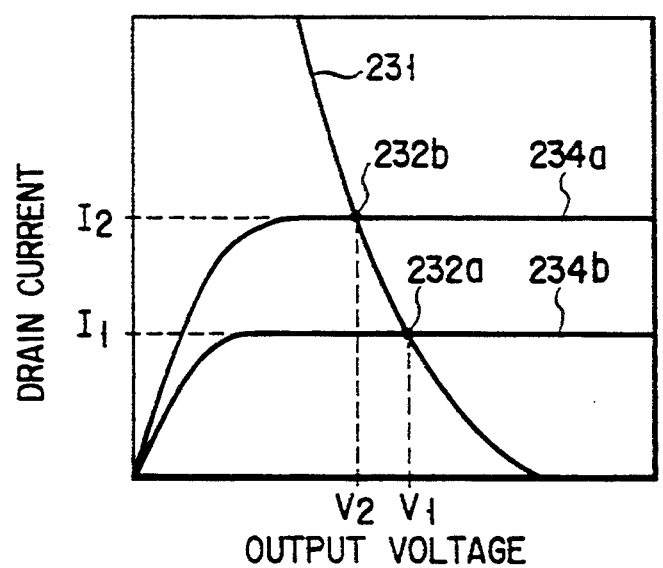
F I G. 11

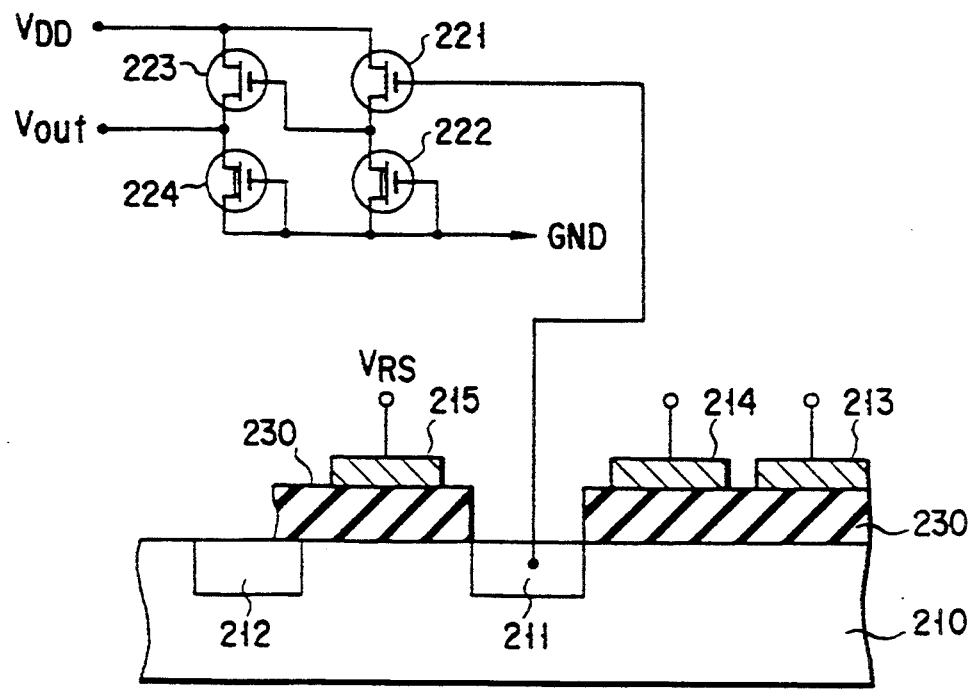
FIG. 14
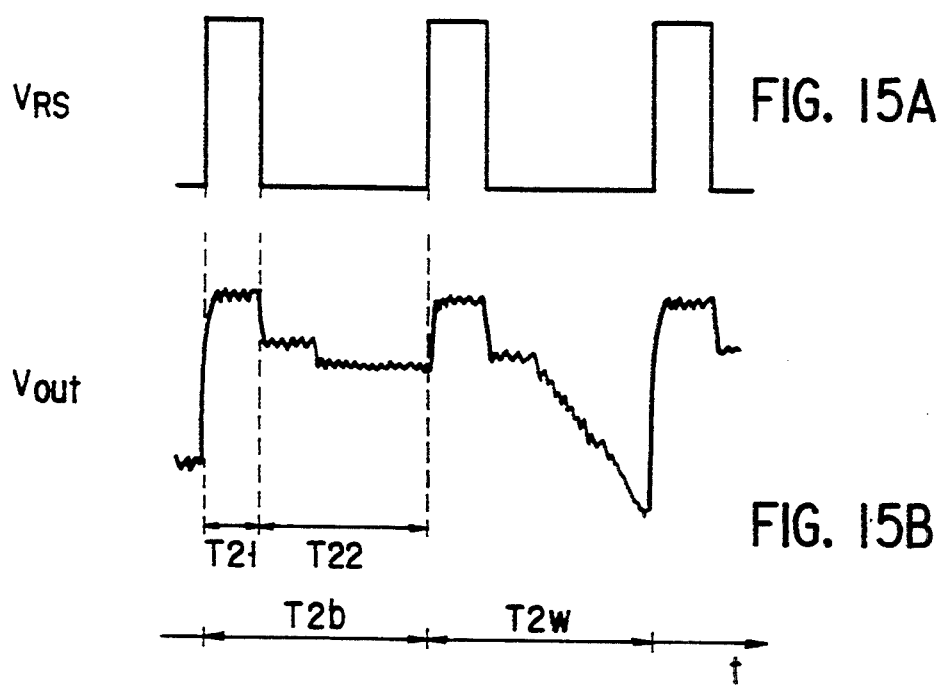
FIG. 15A
FIG. 15B

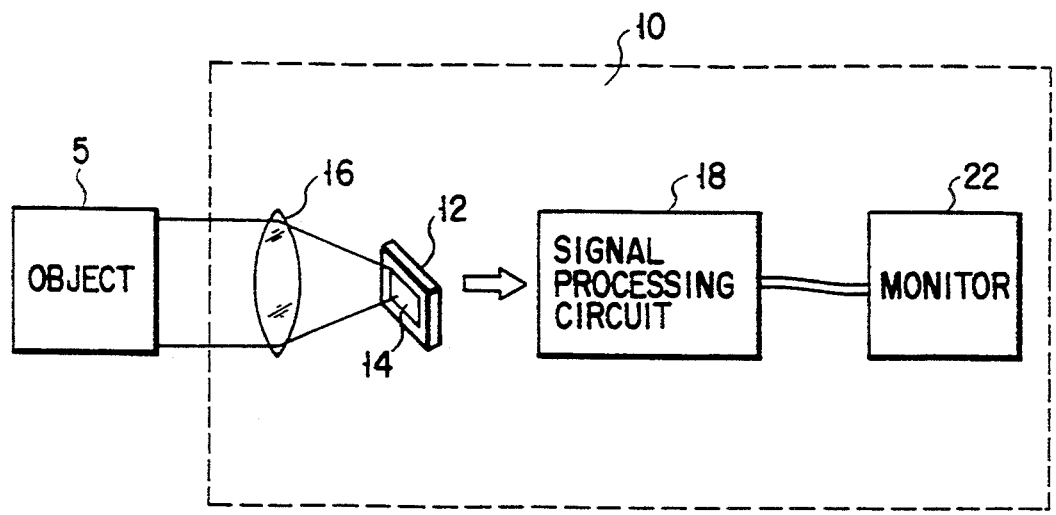
F I G. 16
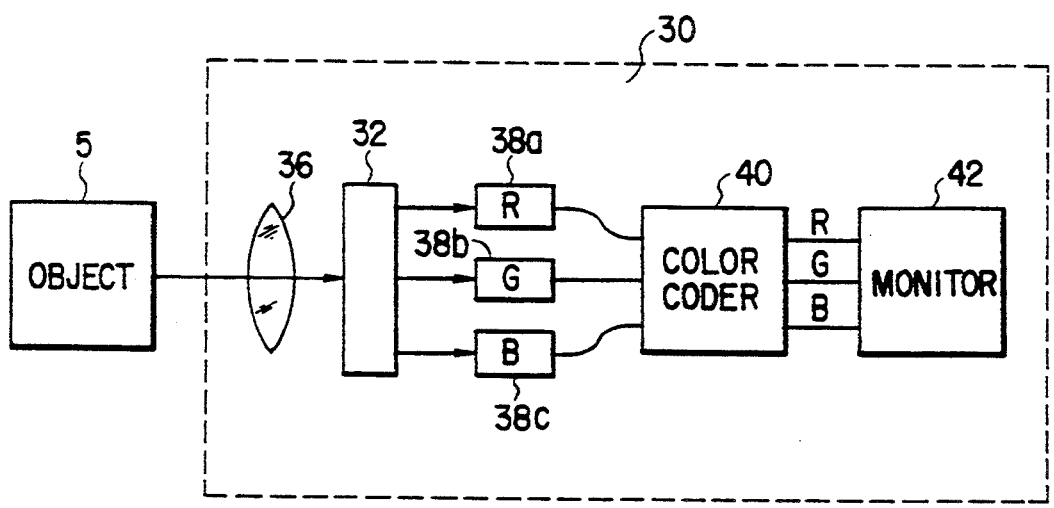
F I G. 17

CHARGE-TRANSFER DEVICE HAVING AN IMPROVED CHARGE-SENSING SECTION

BACKGROUND OF THE INVENTION

1. Field of the Invention

This invention relates to a charge-transfer device using the principle of charge-coupled devices (hereinafter, abbreviated as CCDs), and more particularly to a charge-transfer device with an improved charge-sensing section.

2. Description of the Related Art

Recently, solid-state imaging systems using CCDs, a type of charge-transfer device, have been used in video cameras, electronic still cameras, and the like. The solid-state imaging system comprises a photoelectric conversion section for converting light into an electric signal (signal charge), a charge-transfer section for transferring the signal charge, and a charge-sensing section for sensing the transferred signal charge and converting it into a voltage signal. The charge-transfer device is made up of the charge-transfer section and the charge-sensing section.

One known charge-sensing section provided in the charge-transfer device is a floating diffusion amplifier (hereinafter, abbreviated as an FDA) placed next to the final stage of the charge-transfer section. The FDA contains a floating diffusion layer (hereinafter, abbreviated as an FD layer) provided between the output terminal of the charge-transfer section and a charge-releasing drain (reset drain). When being transferred from the charge-transfer section to the FD layer, the signal charge is temporarily stored in the FD layer, whose potential thus changes. The potential change at the FD layer is transmitted through an interconnection to the gate electrode of a driver transistor in a source follower circuit, causing the gate potential of the transistor to vary. The source follower circuit amplifies the change of the gate potential to produce a voltage signal, thereby sensing the signal charge. After the charge is sensed and the signal is outputted, the signal charges in the FD layer are released from the charge-releasing drain by opening the reset gate.

FIG. 14 is a schematic diagram of a conventional FDA charge-sensing section, particularly a source follower circuit.

At the surface of a semiconductor substrate 210, an FD layer 211 and a reset drain 212 are formed. Provided above the semiconductor substrate are a CCD transfer electrode 213, an output gate electrode 214, and a reset gate electrode 215, with a $SiO_2$ film 230 underlying these electrodes. The FD layer 211 is electrically connected to the gate electrode of a transistor 221. The source of the transistor 221 is connected to the drain of a load transistor 222, thus forming a first-stage source follower circuit. The source of the transistor 221 is also connected to the gate electrode of a transistor 223. The source of the transistor 223 is connected to the drain of a load transistor 224, thus forming an output-stage source follower circuit. The gate electrodes of the load MOS transistors 222, 224 are both connected to the ground.

In the FDA charge-sensing section thus constructed, a parasitic capacity ascribed to the wiring from the FD layer to the gate electrode of the driver transistor in the source follower circuit is large. Because of this, the change of potential per stored charge cannot be made larger, and therefore it is difficult to sense charges with high sensitivity. It is also difficult to reduce kTC noise caused by release of the signal charge.

FIG. 15 shows the waveform of voltage $V_{RS}$ at the reset gate electrode 215 and that of the output voltage $V_{OUT}$. As shown in the figure, the waveform of output voltage $V_{OUT}$ always contains noise. The noise is formed such that thermal noise generated at the reset gate electrode 215 is dominant over period T21 where the reset gate electrode 215 is on, and thermal noise created at the transistor 221 is dominant over period T22 where the reset gate electrode 215 is off and the signal charges are injected into the FD layer 211. Period T2$b$ corresponds to a case where the signal charges are absent, and period T2$w$ corresponds to a case where the signal charges are present.

In order to reduce noise in the FDA, the constant currents in the depletion-mode MOS transistors 222, 224 acting as loads in the source follower circuits may possibly be decreased. Decreasing the constant currents in the source followers, however, reduces the mutual conductance of the source followers, making it impossible for the FDA to respond rapidly. Therefore, the necessity of ensuring fast response makes it very difficult to decrease noise in the FDA. In addition, because the constant currents in the load MOS transistors 222, 224 cannot be reduced, there arises the problem of being unable to reduce the power consumption in the FDA.

To overcome these problems, a charge-transfer device with a charge-sensing section has been developed, as shown in U.S. Pat. No. 4,984,045 issued on Jan. 8, 1991. The charge-transfer device disclosed in the publication uses a buried channel layer of a charge-sensing MOS transistor placed next to the final stage of the charge-transfer section.

Because this structure has neither contact region nor interconnection for connecting the FD layer to the driver transistor of the source follower circuit, a parasitic capacity at the charge-sensing section can be decreased. This makes it possible to make the potential change per stored charge larger, thereby enabling charge to be sensed with high sensitivity. Because the stored charges can be discharged completely with the help of floating and control gates, it is possible to eliminate kTC noise generated at the reset gate.

with this structure, however, a higher power-supply voltage (e.g., −80 V) than a commonly used CCD power-supply voltage (e.g., 15 V) is required to operate the control gate, as described in Matsunaga, et al., "A Highly Sensitive On-Chip Charge Detector for CCD Area Image Sensor," IEEE JOURNAL OF SOLID-STATE CIRCUITS, Vol. 26, No. 4, April 1991. Furthermore, use of two layers of gates, the floating gate and the control gate, complicates the structure of the output sensing section and its manufacturing process.

SUMMARY OF THE INVENTION

Accordingly, an object of the present invention is to provide a simple charge-transfer device which can produce a highly sensitive output of signal charge and operate on a low voltage.

Another object of the present invention is to provide a charge-transfer device with a FDA designed to improve a signal-to-noise ratio and consume less power.

According to a first aspect of the present invention, there is provided a charge-transfer device comprising a semiconductor substrate of a first conductivity type having a surface, a high-resistance well layer of a second conductivity type formed in the surface of the substrate, a charge-transfer channel layer of the first conductivity type formed in the surface of the well layer, a charge storage channel layer of the first conductivity type formed in the surface of the substrate so as to connect with the transfer channel layer, a charge release channel layer of the first conductivity type formed in the surface of the substrate so as to connect with the storage channel layer, a charge release drain layer of the first conductivity type formed in the surface of the substrate so as to connect with the release channel layer, an output gate electrode provided above the junction of the transfer channel layer and the storage channel layer, with an insulating film interposed therebetween, a covering insulating film formed on the storage channel layer, a reset gate electrode provided above the release channel layer, with an insulating film interposed therebetween, a charge-sensing channel layer of the second conductivity type of a charge-sensing transistor, formed in the substrate such that said sensing channel layer and the storage channel layer are stacked each other, and a source and drain layers of the second conductivity type of the charge-sensing transistor, formed in the surface of the substrate so as to face each other with the sensing channel layer interposed therebetween, wherein the storage channel layer contains a first surface portion which adjoins the transfer channel layer and is in contact with the covering insulating film, and a second surface portion which adjoins the release channel layer and is in contact with the covering insulating film.

According to a second aspect of the present invention, there is provided a charge-transfer device comprising a semiconductor substrate of a first conductivity type having a surface, a high-resistance well layer of a second conductivity type formed in the surface of the substrate, a charge-transfer channel layer of the first conductivity type formed in the surface of the well layer, a charge storage channel layer of the first conductivity type formed in the surface of the substrate so as to connect with the transfer channel layer, a charge release channel layer of the first conductivity type formed in the surface of the substrate so as to connect with the storage channel layer, a charge release drain layer of the first conductivity type formed in the surface of the substrate so as to connect with the release channel layer, an output gate electrode provided above the junction of the transfer channel layer and the storage channel layer, with an insulating film interposed therebetween, a covering insulating film formed on the storage channel layer, a reset gate electrode provided above the release channel layer, with an insulating film interposed therebetween, a charge-sensing channel layer of the second conductivity type of a charge-sensing transistor, formed in the substrate such that the sensing channel layer and the storage channel layer are stacked each other, and a source and drain layers of the second conductivity type of the charge-sensing transistor, formed in the surface of the substrate so as to face each other with the sensing channel layer interposed therebetween, wherein the potential of the storage channel layer without charges is set higher than that of the release drain layer.

According to a third aspect of the present invention, there is provided a charge-transfer device comprising a charge-coupled element composed of a plurality of transfer electrodes arranged above a semiconductor substrate with a gate insulating film underlying those electrodes, a floating diffusion layer which is formed adjacent to the output terminal of the charge-coupled element and which temporarily stores the signal charges transferred from the element, and amplifying means which amplifies the voltage signal generated in the floating diffusion layer and outputs the amplified signal, and which comprises a driving transistor and a load transistor for controlling the current in the driving transistor, wherein the mutual conductance of the driving transistor is controlled by applying a voltage to the gate of the load transistor over the period including the period that the signal charges transferred from the charge-coupled element to be supplied to the amplifying means flow into the floating diffusion layer and change there, and by applying another voltage different from the voltage to the same gate over the other periods.

In the charge-transfer device according to the first aspect of the invention, the storage channel layer has surfaces which adjoin the transfer channel layer and the release channel layer and are in contact with the covering insulating film. This arrangement reduces the coupling capacity between the sensing channel layer and the output gate electrode and that between the sensing channel layer and the reset gate electrode. As a result, it is possible to make the potential change per signal charge larger, and therefore provide a charge-sensing section with a greater current-to-voltage conversion gain due to the signal charges, or with high sensitivity.

In the charge-transfer device according to the second aspect of the invention, the potential of the storage channel layer without charges is set higher than that of the release drain layer. Specifically, by enabling the signal charges to be sensed in what is called an incomplete transfer mode, sense errors ascribed to irregularities in the potential and a potential pocket within the storage channel layer can be avoided. As a result, it is unnecessary to provide a control gate and floating gate for helping release the signal charges. This not only simplifies the configuration of the device and the manufacturing processes, but also requires no high-voltage power supply for the control gate.

In the charge-transfer device according to the third aspect of the invention, the mutual conductance of the driving transistor is controlled by applying a voltage to the gate of the load transistor in the source follower circuit over the period including the period that the signal charges flow into the floating diffusion layer and change there, and by applying another voltage different from the voltage to the same gate over the other periods. Specifically, this provides control to reduce noise and the power consumption such that the bias current to the source follower circuit is made larger only during a period when the FDA is required to respond rapidly as at the instance when the input signal information changes, and the bias current is made smaller during a period when the FDA is not required to respond fast. This makes it possible to reduce noise in the FDA and its power consumption without impairing the necessary high-speed response. Accordingly, it is possible to reduce noise and the power consumption in the charge-transfer device.

It is preferable to secure a high speed response by applying a high voltage to the gate of the load transistor during the period including at least the period from when the voltage signal starts to change from the field-through level to the signal level until the voltage signal reaches the signal level sufficiently, and by applying a lower voltage to the gate to reduce the power consumption during a period in which a high speed response is insignificant.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4A is a plan view of a charge-transfer device according to still another embodiment of the present invention, and FIGS. 4B and 4C are sectional views taken along line IVB—IVB and line IVC—IVC of FIG. 4A, respectively;

FIG. 10 is an enlarged sectional view of the FDA charge-sensing section in a charge-transfer device according to still another embodiment of the present invention;

FIG. 11 is a graph of the drain current versus output voltage characteristic of the source follower circuit of FIG. 10;

FIG. 14 is a schematic diagram of the FDA charge-sensing section in a conventional charge-transfer device;

FIG. 15 is a waveform chart of the output of the FDA in the device of FIG. 14;

FIG. 16 is a block diagram of a camera using a charge-transfer device according to an embodiment of the present invention; and FIG. 17 is a block diagram of another camera using a charge-transfer device according to an embodiment of the present invention.

DETAILED DESCRIPTION OF THE PREFERRED EMBODIMENTS

Figure 1A:
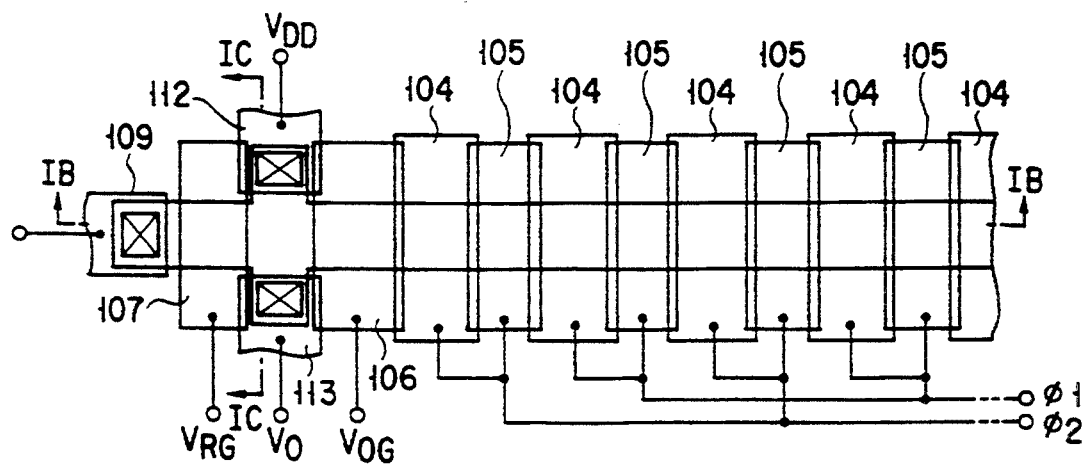
FIG. 1A is a plan view of a charge-transfer device according to an embodiment of the present invention.
Figure 1B:
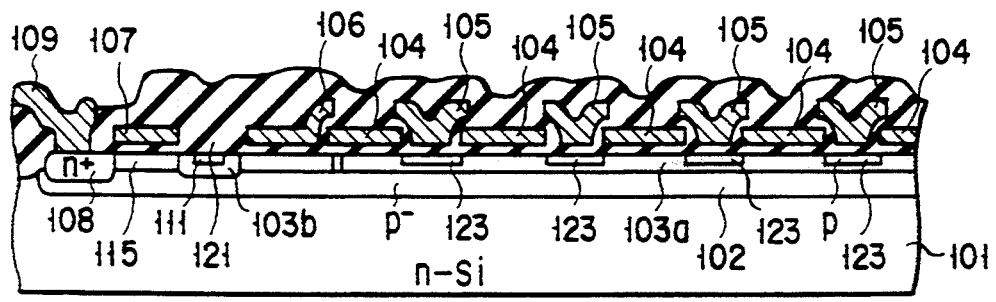
FIGS. 1B and 1C are sectional views taken along line IB—IB and line IC—IC of FIG. 1A, respectively.
Figure 1C:
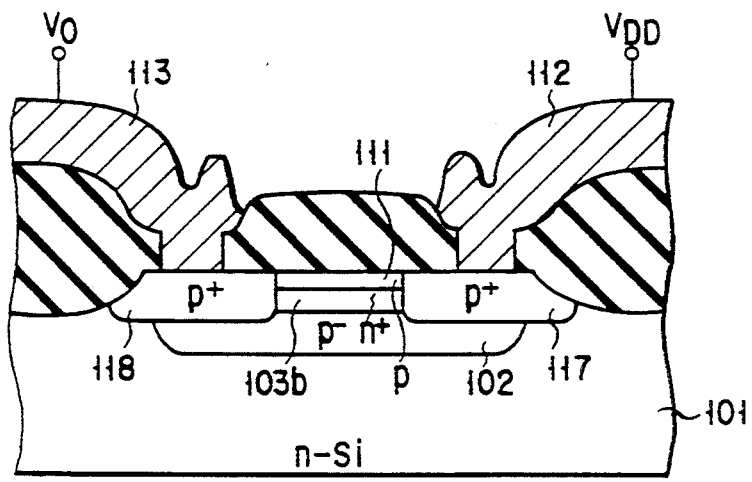
Figure 2A:
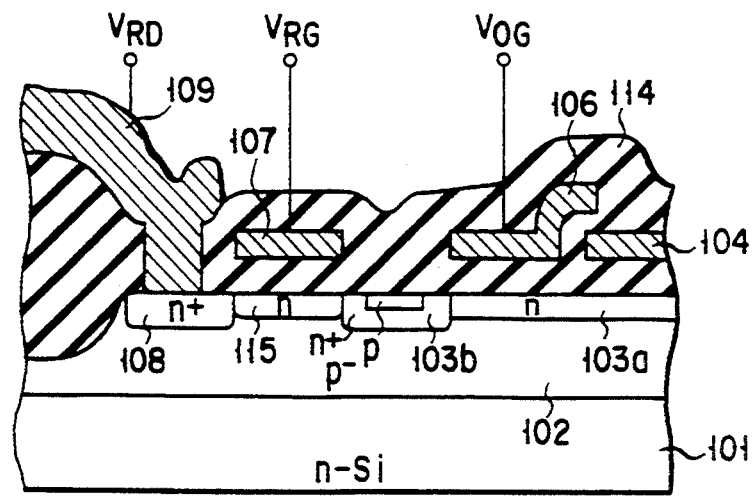
FIG. 2A is an enlarged sectional view of the charge-sensing section of FIG. 1B, and FIGS. 2B to 2D show the potential distribution corresponding to each portion in the sectional view of FIG. 2A.

FIG. 1A is a plan view of a charge-transfer device according to an embodiment of the present invention, and FIGS. 1B and 1C are sectional views taken along line IB—IB and line IC—IC of FIG. 1A, respectively. FIG. 2A is an enlarged sectional view of the charge-sensing section in the charge-transfer device of FIG. 1B.

The charge-transfer device is formed on an n-type semiconductor substrate, or an n-type substrate 101. In the substrate 101, a $p^-$-well layer 102 of low impurity concentration or high resistance (an impurity concentration of $1 \times 10^{12}$ to $1 \times 10^{17}$ cm$^{-3}$) is formed. In the embodiment, for example, a $+10$ V and 0 V bias voltages are applied to the substrate 101 and the well layer 102, respectively, in relation to the ground voltage.

At the surface of the high-resistance well layer 102, a charge-transfer n-channel layer 103a (an impurity concentration of $1 \times 10^{14}$ to $1 \times 10^{19}$ cm$^{-3}$) is formed along line IB—IB in which a plurality of p-type layers 123 are formed at specific intervals. Furthermore, at the surface of the well layer 102, a charge storage n+-channel layer 103b (an impurity concentration of $1 \times 10^{17}$ to $1 \times 10^{21}$ cm$^{-3}$), a charge release n-channel layer 115 (an impurity concentration of $1 \times 10^{14}$ to $1 \times 10^{19}$ cm$^{-3}$), and a charge release n+-type drain layer 108 (an impurity concentration of $1 \times 10^{17}$ to $5 \times 10^{22}$ cm$^{-3}$) are formed along line IB—IB in that order, following the charge-transfer n-channel layer 103a.

Provided above the charge-transfer n-channel 103a and the p-type layer 123 are pairs of first and second charge-transfer electrodes 104, 105, with an insulating film 121 underlying these electrodes. An output gate electrode 106 is provided next to the charge storage n+-channel layer 103b and above the charge transfer n-channel layer 103a, with the insulating film 121 underlying this electrode. Above the charge release n-channel layer 115, a reset gate electrode 107 is formed, with the insulating film 121 underlying this electrode. The charge release n+-type drain layer 108 is connected to a release interconnection 109.

At the surface of the charge storage n+-channel layer 103b, a p-channel layer 111 of a charge-sensing PMOS transistor is formed. At the surface of the well layer 102, source/drain layers 117,118 of the charge-sensing PMOS transistor are formed on both sides of the p-channel layer 111 along line IC—IC. An interconnection 112 for power supply $V_{DD}$ is connected to the source/drain layer 117, and an interconnection 113 for output Vo is connected to the source/drain layer 118.

As shown in FIG. 2A, the p-channel layer 111 is formed in the charge storage n+-channel layer 103b so as to be in contact with neither the charge-transfer n-channel layer 103a nor the charge release n-channel layer 115. In other words, the n+-channel layer 103b has such a structure as provides an exposed surface between the p-channel layer 111 and the n-channel layer 103a and between the p-channel layer 111 and the n-channel layer 115 and is in contact with the insulating film 121.

The operation of the charge-transfer device thus constructed will be described below.

First, the first and second transfer electrodes 104,105 driven in two phases by control signals $\phi 1$ and $\phi 2$, allow signal charges to go over the potential of the output gate electrode 106 and be transferred to the charge storage n+-channel layer 103b, which stores those charges temporarily. The transfer is effected while a driving voltage $V_{RG}$ set to level "L" is being applied to the reset gate electrode 107 and a specific constant voltage $V_{OG}$ is being applied to the output gate electrode 106.

The signal charges transferred to the channel layer 103b modulate the potential of the channel 111 of the charge-sensing PMOS transistor shown in FIG. 1C. The voltage Vo outputted of the interconnection 113 therefore varies with the amount of signal charges. By measuring the variation, the amount of signal charges is sensed. After the measurement of the output voltage variation, the driving voltage $V_{RG}$ set to level "H" is applied to the reset gate electrode 107, thereby allowing the signal charges except for a specific amount of residual ones (explained later) to be discharged to the charge release drain 108.

Figure 2B:
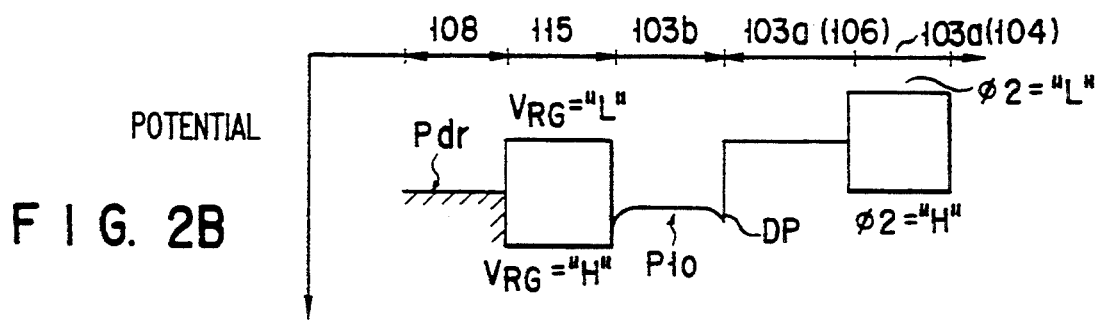
Figure 2C:
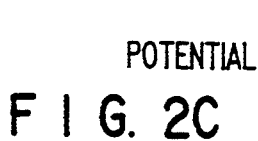
Figure 2D:
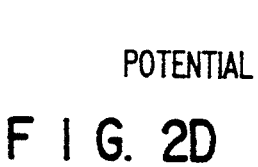

Referring to FIGS. 2B to 2D showing the potential distribution corresponding to each portion in the sectional view of FIG. 2A, how signal charges are sensed in the embodiment will be described.

FIG. 2B shows the potential distribution in a state where there is no charge in the charge storage n+- channel layer 103b. In this state, the potential P1o of the charge storage channel layer 103b is set so as to be higher than the potential Pdr of the charge release drain layer 108. The potential inequality can be set by adjusting the potential of the drain layer 108, the impurity concentration in the channel layer 103b, or both of these. In this embodiment, the potential is made higher by making the impurity concentration in the charge storage channel layer 103b as high as $1 \times 10^{17}$ to $1 \times 10^{21}$ cm$^{-3}$.

In the state shown in FIG. 2B, the potential distribution in the channel layer 103b is non-uniform. Particularly, a potential pocket DP formed adjacent to the charge-transfer n-channel layer 103a can have an adverse effect on the release of signal charges.

FIG. 2C shows the potential distribution after the signal charges or other intentionally supplied charges are temporarily stored in the charge storage n+-channel layer 103b and then are discharged. In the charge storage channel layer 103b, there remains as much charge as makes potential P1r of the channel layer 103b equal to potential Pdr of the charge release drain layer 108, that is, a total amount of charge of as many electrons as correspond to the shaded portion in the figure. Specifically, the unevenness of potential in the channel layer 103b without charges is leveled so that the potential pocket Dp is filled with the remaining charges. In the embodiment, because the exposed surface of the channel layer 103b on both sides of the channel layer 111 is in contact with the insulating film 121, the potential P1r of the channel layer 103b is leveled out, allowing the potential distribution to be uniform in this region.

FIG. 2D shows the potential distribution at the time when the signal charges stored in the charge storage n+-channel layer 103b are being sensed after the state of FIG. 2C. With the potential distribution in the charge storage channel layer 103b being in the state of FIG. 2C, when the signal charges are transferred to the channel layer 103b and stored there, the layer 103b has a potential of P1t as shown in FIG. 2D. At this time, potential variation $\Delta P1 = P1r - P1t$ due to the signal charge inflow is the total amount of inflow signal charges, that is, the total amount of charge of as many electrons as correspond to the shaded portion in the figure.

Specifically, all the signal charges newly flowing into the channel layer 103b appear as a change in the potential of the channel layer 103b, thereby modulating the potential of the channel 111 of the charge-sensing PMOS transistor. As a result, the voltage Vo outputted to the interconnection 113 varies with the total amount of inflow signal charges. By measuring the changes, the amount of signal charges is sensed.

After the signal charges have been sensed, the reset gate is opened to release the signal charges, which permits the potential of the channel layer 103b to return to the state of FIG. 2C. In this specification, an incomplete transfer mode is defined as a mode in which the signal charges are released in a reset operation with a specific amount of charges always being left in the channel layer 103b.

This embodiment has the following advantages as compared with the charge-transfer device disclosed in U.S. Pat. No. 4,984,045 mentioned above.

Because the p-channel 111 is formed so as not to be in contact with the n-channel layers 103a, 115, it is possible to decrease the coupling capacity between the channel layer 111 and the output gate electrode 106 and that between the channel layer 111 and the reset gate electrode 107. As a result, the potential change per signal charge can be made larger, and therefore it is possible to provide a charge-sensing section with a greater current-to-voltage conversion gain due to the signal charges, or with high sensitivity.

By making possible the sensing of signal charges in the incomplete transfer mode, it is possible to avoid sense errors arising from irregularities or a pocket DP in the potential within the charge storage n-channel layer 103b. Namely, it is unnecessary to provide the control and floating gates for helping release the signal charges above the channel layer 103b. This not only simplifies the configuration of the device and the manufacturing processes, but also requires no high-voltage power supply for the control gate.

Figure 3A:
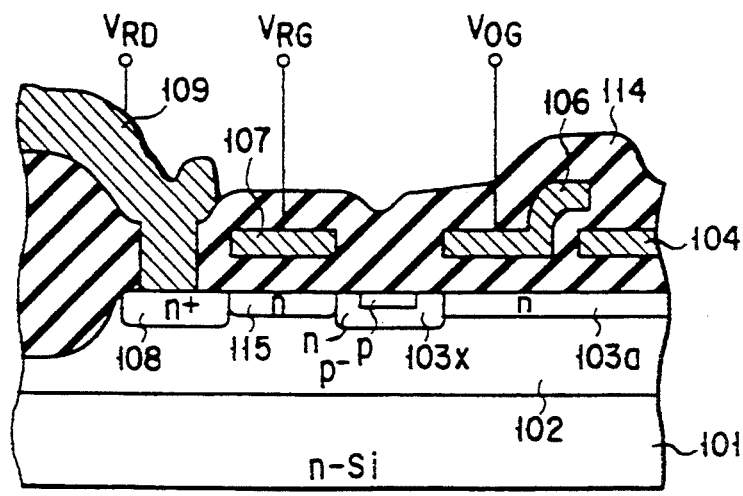
FIG. 3A is an enlarged sectional view of the charge-sensing section in a charge-transfer device according to another embodiment of the present invention.

FIG. 3A is an enlarged sectional view of the charge-sensing section in a charge-transfer device according to another embodiment of the present invention. This embodiment has the same configuration as that of the embodiment shown in FIGS. 1A to 1C and FIG. 2A except that potential P2o of a charge storage channel layer 103x without charges is set lower than potential Pdr of the charge release drain layer 108.

Figure 3B:
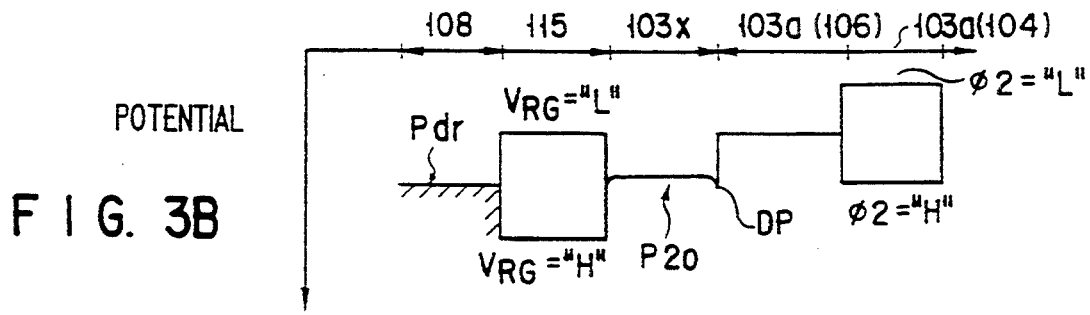
FIGS. 3B to 3D show the potential distribution corresponding to each portion in the sectional view of FIG. 3A.
Figure 3C:
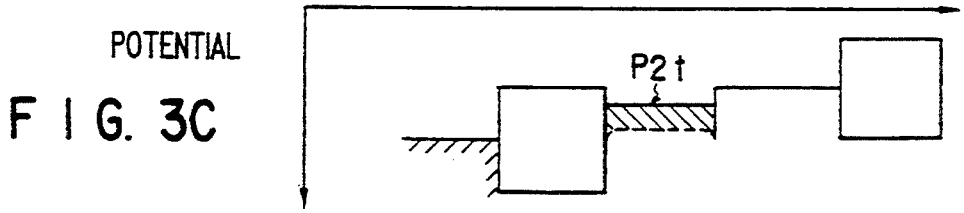
Figure 3D:
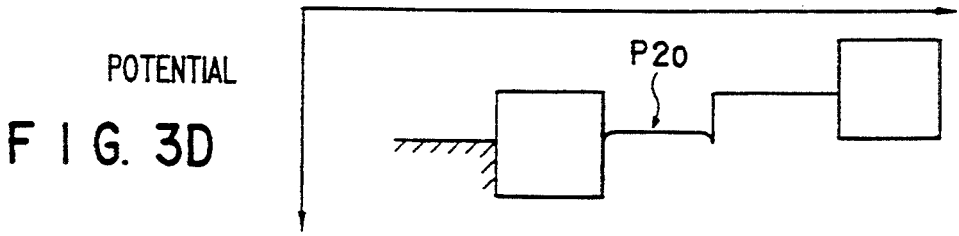

The present embodiment will be described with reference to FIGS. 3B to 3D showing the potential distribution corresponding to each portion in the sectional view of FIG. 3A.

FIG. 3B shows the potential distribution in a state where there is no charges in the charge storage n-channel layer 103x. In this state, potential P2o of the charge storage channel layer 103x is set so as to be lower than potential Pdr of the charge release drain layer 108. The potential inequality can be set by adjusting the potential of the drain layer 108, the impurity concentration in the channel layer 103x, or both of these. In this embodiment, the potential of the channel layer 103x is made lower by making the impurity concentration in the charge storage channel layer 103x as low as $1 \times 10^{15}$ to $1 \times 10^{19}$ cm$^{-3}$, less than that in the channel layer 103b in the previous embodiment.

FIG. 3C shows the potential distribution at the time when the signal charges stored in the charge storage n-channel layer 103x are being sensed. When the signal charges are transferred to the channel layer 103x and stored there, the channel layer 103x has a potential of P2t, thereby modulating the potential of the channel 111 of the charge-sensing PMOS transistor. The voltage Vo outputted to the interconnection 113 therefore varies with the amount of signal charges. By measuring the variation, the amount of signal charges is sensed.

FIG. 3D shows the potential distribution after the reset gate is opened and the signal charges are released. All the charges stored in the channel layer 103x are essentially released into the charge release drain layer 108, with the result that the potential of the channel layer 103 returns to the original P2o. In the potential pocket DP in the channel layer 103x, there still can be unstable residual charges left. In this specification, a complete transfer mode is defined as a mode in which all of the signal charges are essentially released in a reset operation.

With the embodiment of FIG. 3A, the coupling capacity between the channel layer 111 and the output gate electrode 106 and that between the channel layer 111 and the reset gate electrode 107 can be decreased, thereby achieving the highly sensitive charge-sensing section. Because the control and floating gates for helping release the signal charges are eliminated, this not only simplifies the configuration of the device and its manufacturing processes, but also requires no high-voltage power supply for the control gate.

Figure 5A:
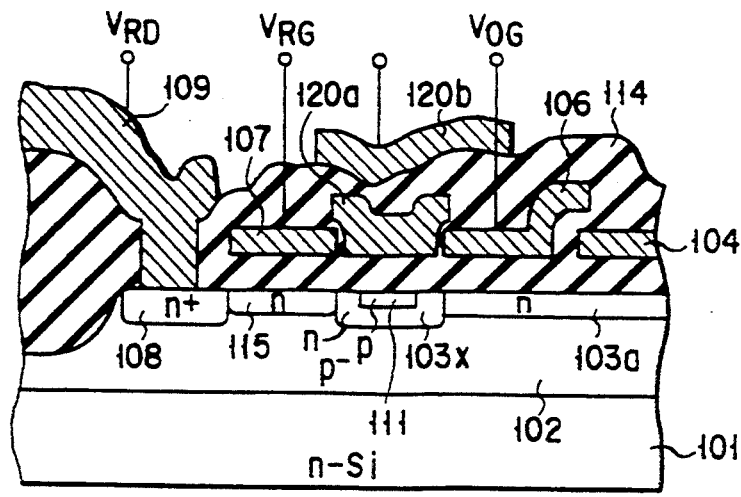
FIG. 5A is an enlarged sectional view of the charge-sensing section of FIG. 4B and FIGS. 5B to 5D show the potential distribution corresponding to each portion in the sectional view of FIG. 5A.

FIG. 4A is a plan view of a charge-transfer device according to still another embodiment of the present invention. FIGS. 4B and 4C are sectional views taken along line IVB—IVB and line IVC—IVC of FIG. 4A, respectively. FIG. 5A is an enlarged sectional view of the charge-sensing section in the charge-transfer device of FIG. 4B.

This embodiment has the same configuration as the embodiment shown in FIGS. 1A to 1C and FIG. 2A except that potential P3o of the charge storage channel layer 103x without charges is set lower than potential Pdr of the charge release drain layer 108 and that there are provided a control gate and a floating gate for helping release the signal charges.

In this embodiment, a floating gate electrode 120a is provided above the charge storage channel layer 103x and channel layer 111 with the insulating film 121 underlying this electrode. A control gate electrode 120b is provided above the floating gate electrode 120a, with an insulating film 114 underlying this electrode 120b. A negative high voltage can be applied to the control gate electrode 120b, which is designed to act on the charge storage channel layer 103x by way of the floating gate electrode 120a to which no voltage is applied.

Figure 5B:
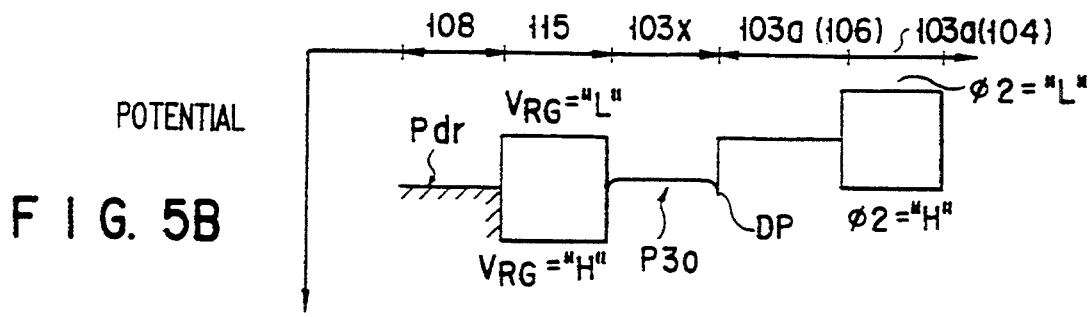
Figure 5C:
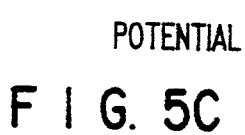
Figure 5D:
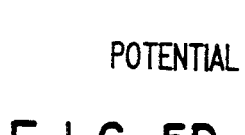

The present embodiment will be described with reference to FIGS. 5B to 5D showing the potential distribution corresponding to each portion in the sectional view of FIG. 5A.

FIG. 5B shows the potential distribution in a state where no voltage is applied to the control gate electrode 120b and there is no charges in the charge storage n-channel layer 103x. In this state, potential P3o of the charge storage channel layer 103x is set so as to be lower than potential Pdr of the charge release drain layer 108. In this embodiment, the potential of the charge storage channel layer 103x is made lower by making the impurity concentration in the layer 103x as low as $1 \times 10^{15}$ to $1 \times 10^{19}$ cm$^{-3}$.

In the state shown in FIG. 5B, the potential distribution in the channel layer 103x is non-uniform. Particularly, a potential pocket DP formed adjacent to the charge-transfer n-channel layer 103a can have an adverse effect on the release of signal charges.

FIG. 5C shows the potential distribution in a state where a negative voltage is applied to the control gate electrode 120b. Under the influence of the applied voltage, the potential of the channel layer 103x changes to potential P3r. At this time, the potential pocket DP disappears, which allows the potential to extend continuously from the charge-transfer n-channel layer 103a to the charge storage n-channel layer 103x. The application of a negative voltage to the control gate electrode 120b is performed to prevent unstable residual charges from remaining in the potential pocket DP in releasing signal charges or in a resetting operation. Therefore, the voltage has only to be applied at the time of resetting only. In the present embodiment, however, to simplify the operation, a negative voltage is always applied to the control gate electrode 120b.

FIG. 5D shows the potential distribution in a state where a negative voltage is applied to the control gate electrode 120b and the signal charges stored in the charge storage n-channel layer 103x are being sensed. When the signal charges are transferred to the channel layer 103x and stored there, the channel layer 103x has a potential of P3t, thereby modulating the potential of the channel 111 of the charge-sensing PMOS transistor. The voltage Vo outputted to the interconnection 113 therefore varies with the total amount of inflow signal charges. By measuring the variation, the amount of signal charges is sensed.

After the signal charges have been sensed, the reset gate is opened and the signal charges are released. This causes the potential of the channel layer 103x to return to the state of FIG. 5C. That is, this embodiment is operated in the complete transfer mode.

With the embodiment of FIG. 5A, the coupling capacity between the channel layer 111 and the output gate electrode 106 and that between the channel layer 111 and the reset gate electrode 107 can be decreased, thereby achieving the highly sensitive charge-sensing section. Additionally, use of the control and floating gates prevents unstable residual charges from remaining in the channel layer 103x.

In the embodiment of FIG. 5A, the floating gate electrode 120a may be omitted. In this case, the control gate electrode 120b may be arranged closer to the channel layer 103x with a power supply of a lower voltage. With such a modification, the manufacturing processes of the device are simplified and the voltage of a necessary power supply is lowered.

The floating gate electrode 120a and the control gate electrode 120b may be made of a low resistive material, such as polycrystalline silicon, aluminum, tungsten silicide, or molybdenum silicide.

Figure 6A:
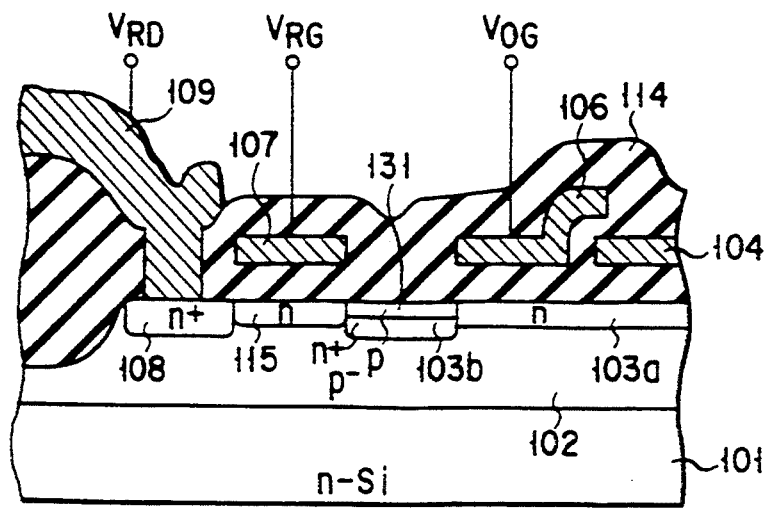
FIG. 6A is an enlarged sectional view of the charge-sensing section in a charge-transfer device according to still another embodiment of the present invention.

FIG. 6A is an enlarged sectional view of the charge-sensing section in a charge-transfer device according to still another embodiment of the present invention. This embodiment has the same configuration as the embodiment shown in FIGS. 1A to 1C and FIG. 2A except that a p-channel layer 131 is formed so as to extend fully from the n-channel layer 103a to the n-channel layer 115.

Figure 6B:
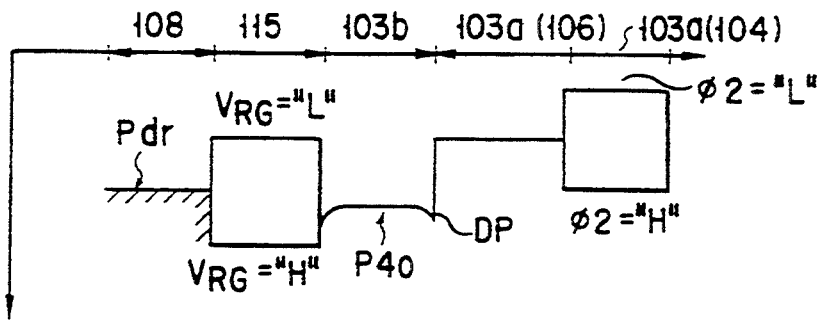
FIGS. 6B to 6D show the potential distribution corresponding to each portion in the sectional view of FIG. 6A.
Figure 6C:
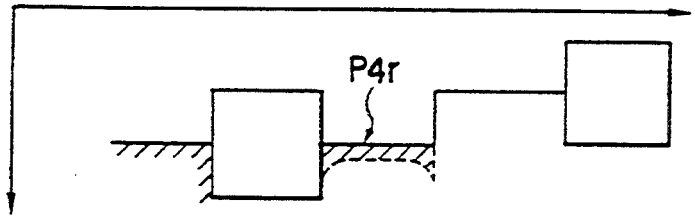
Figure 6D:
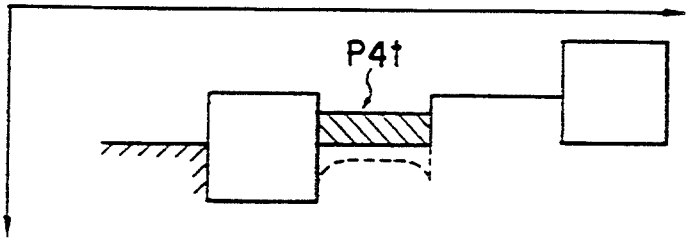

How the signal charges are sensed in the present embodiment will be described with reference to FIGS. 6B to 6D showing the potential distribution corresponding to each portion in the sectional view of FIG. 6A.

FIG. 6B shows the potential distribution in a state where there is no charges in the charge storage n+-channel layer 103b. In this state, potential P4o of the charge storage channel layer 103b is set so as to be higher than potential Pdr of the charge release drain layer 108. The potential inequality can be set by adjusting the potential of the drain layer 108, the impurity concentration in the channel layer 103b, or both of these. In this embodiment, the potential of the charge storage channel layer 103b is made higher by making the impurity concentration in the layer 103b as high as $1 \times 10^{17}$ to $1 \times 10^{21}$ cm$^{-3}$.

In the state shown in FIG. 6B, the potential distribution in the channel layer 103b is non-uniform. Particularly, a potential pocket DP formed adjacent to the charge-transfer n-channel layer 103a can have an adverse effect on the release of signal charges.

FIG. 6C shows the potential distribution after the signal charges or other intentionally supplied charges are temporarily stored in the charge storage n+-channel layer 103b and then are discharged. In the charge storage channel layer 103b, there remains as much charge as makes potential P4r of the channel layer 103b equal to potential Pdr of the charge release drain layer 108, that is, the total amount of charge of as many electrons as correspond to the shaded portion in the figure. Specifically, the unevenness of potential in the channel layer 103b without charges is leveled so that the potential pocket Dp is filled with the remaining charges.

FIG. 6D shows the potential distribution at the time when the signal charges stored in the charge storage n+-channel layer 103b are being sensed after the state of FIG. 6C. With the potential distribution in the charge storage channel layer 103b being in the state of FIG. 6C, when the signal charges are transferred to the channel layer 103b and stored there, the layer 103b has a potential of P4t as shown in FIG. 6D. At this time, potential variation ΔP4=P4r−P4t due to the signal charge inflow is the total amount of inflow signal charges, that is, the total amount of charge of as many electrons as correspond to the shaded portion in the figure.

Specifically, all the signal charges newly flowing into the channel layer 103b appear as a change in the potential of the channel layer 103b, thereby modulating the potential of the channel 131 of the charge-sensing PMOS transistor. As a result, the voltage Vo outputted to the interconnection 113 varies with the total amount of inflow signal charges. By measuring the changes, the amount of signal charges is sensed.

After the signal charges have been sensed, the reset gate is opened to release the signal charges, which permits the potential of the channel 103b to return to the state of FIG. 6C. Namely, this embodiment is operated in the incomplete transfer mode.

With the embodiment of FIG. 6A, the control and floating gates for helping release the signal charges are eliminated and the signal charges can be sensed in the incomplete transfer mode. This not only simplifies the configuration of the device and its manufacturing processes, but also requires no high-voltage power supply for the control gate.

Figure 7A:
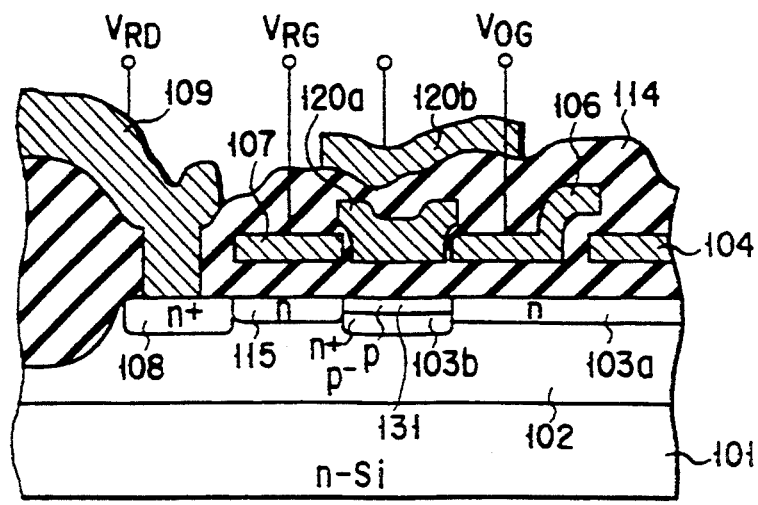
FIG. 7A is an enlarged sectional view of the charge-sensing section in a charge-transfer device according to still another embodiment of the present invention.

FIG. 7A is an enlarged sectional view of the charge-sensing section in a charge-transfer device according to still another embodiment of the present invention. This embodiment has the same configuration as the embodiment of FIG. 6A except that a control gate and a floating gate for helping release the signal charges are provided.

The control and floating gates are formed in the same arrangement as shown in FIGS. 4A to 4C. Specifically, the floating gate electrode 120a is provided above the charge storage channel layer 103b and channel layer 131, with the insulating film 121 underlying this electrode. The control gate electrode 120b is provided above the floating gate electrode 120a, with the insulating film 114 underlying this electrode 120b. A negative high voltage can be applied to the control gate electrode 120b, which is designed to act on the charge storage channel layer 103b by way of the floating gate electrode 120a to which no voltage is applied.

Figure 7B:
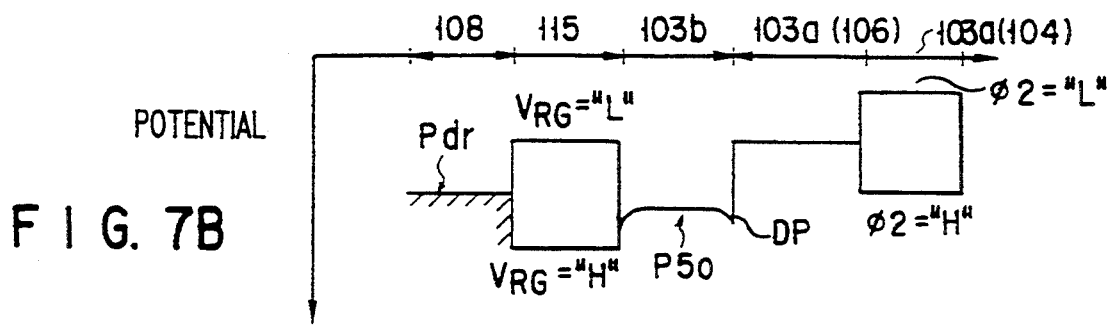
FIGS. 7B to 7D show the potential distribution corresponding to each portion in the sectional view of FIG. 7A.
Figure 7C:
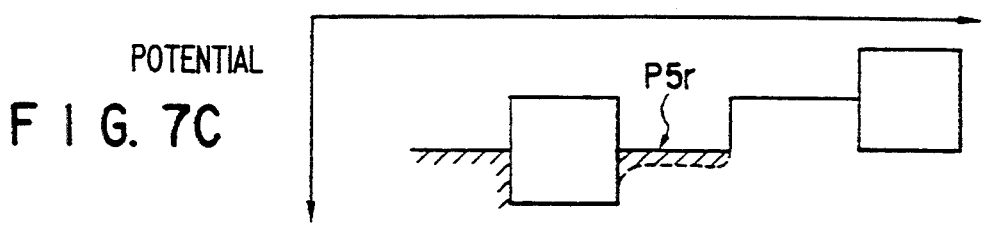
Figure 7D:
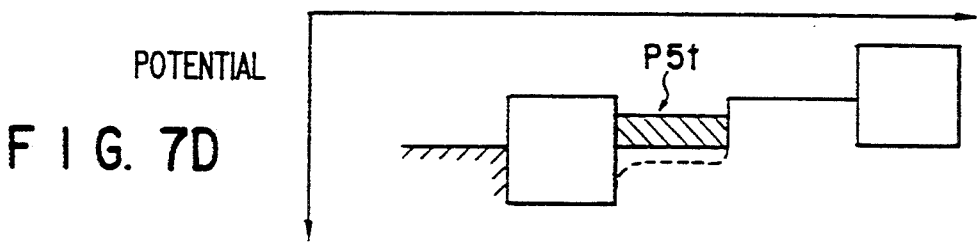

The present embodiment will be described with reference to FIGS. 7B to 7D showing the potential distribution corresponding to each portion in the sectional view of FIG. 7A.

FIG. 7B shows the potential distribution in a state where no voltage is applied to the control gate electrode 120b and there is no charges in the charge storage n-channel layer 103b. In this state, potential P5o of the charge storage channel layer 103b is set so as to be higher than potential Pdr of the charge release drain layer 108. In this embodiment, the potential of the charge storage channel layer 103b is made higher by making the impurity concentration in the layer 103b as high as $1 \times 10^{17}$ to $1 \times 10^{21}$ cm$^{-3}$.

FIG. 7C shows the potential distribution with a negative voltage being applied to the control gate electrode 120b, and after the signal charges or other intentionally supplied charges are temporarily stored in the charge storage n+-channel layer 103b and then are discharged. In the charge storage channel layer 103b, there remains as much charge as makes potential P5r of the channel layer 103b equal to potential Pdr of the charge release drain layer 108, that is, the total amount of charge of as many electrons as correspond to the shaded portion in the figure.

FIG. 7D shows the potential distribution in a state where the signal charges stored in the charge storage n+-channel layer 103b are being sensed after the state of FIG. 7C. When the signal charges are transferred to the channel layer 103b and stored there, the channel layer 103b has a potential of P5t. The change of the potential of the channel layer 103b modulates the potential of the channel 131 of the charge-sensing PMOS transistor. The voltage Vo outputted to the interconnection 113 therefore varies with the total amount of the signal charges. By measuring the variation, the amount of signal charges is sensed.

After the signal charges have been sensed, the reset gate is opened and the signal charges are released. This causes the potential of the channel layer 103b to return to the state of FIG. 7C. That is, this embodiment is operated in the incomplete transfer mode.

With the embodiment of FIG. 7A, because the signal charges can be sensed in the incomplete transfer mode, the control gate can operate on a low voltage and therefore requires no high-voltage power supply.

Figure 8:
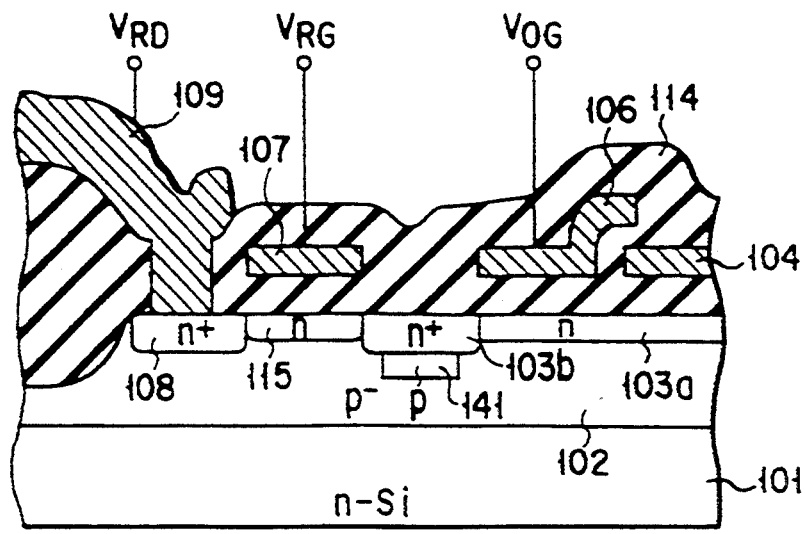
FIG. 8 is an enlarged sectional view of the charge-sensing section in a charge-transfer device according to still another embodiment of the present invention.

FIG. 8 is an enlarged sectional view of the charge-sensing section in a charge-transfer device according to still another embodiment of the present invention. This embodiment has the same configuration as the embodiment shown in FIGS. 1A to 1C and FIG. 2A except that a p-channel layer 141 of the charge-sensing PMOS transistor is formed in a different position.

In this embodiment, the entire top surface of the charge storage n+-channel layer 103b formed between the charge-transfer n-channel layer 103a and the charge release n-channel layer 115 is in contact with the insulating film 121. A charge-sensing p-channel layer 141 (an impurity concentration of $1 \times 10^{14}$ to $1 \times 10^{18}$ cm$^{-3}$) is formed in the high-resistance p$^-$-well layer 102 (an impurity concentration of $1 \times 10^{12}$ to $1 \times 10^{17}$ cm$^{-3}$) so as to be in contact with the bottom of the n+-channel layer 103b. The p-channel layer 141 is located so as to be in contact with neither the charge-transfer n-channel layer 103a nor the charge release n-channel layer 115. The p-channel layer 141 can be formed by using a highly accelerated ion implantation machine.

The potential of the charge storage channel layer 103b without charges is set so as to be higher than the potential of the charge release drain layer 108, as explained in the embodiment of FIG. 2A. Namely, the present embodiment is operated in the incomplete transfer mode. The states at that time are basically the same as those shown in FIGS. 2B to 2D.

With the embodiment of FIG. 8, the coupling capacity between the channel layer 141 and the output gate electrode 106 and that between the channel layer 141 and the reset gate electrode 107 can be decreased, thereby achieving the highly sensitive charge-sensing section. Because the control and floating gates for helping release the signal charges can be eliminated, this not only simplifies the configuration of the device and the manufacturing processes, but also requires no high-voltage power supply for the control gate.

Figure 9:
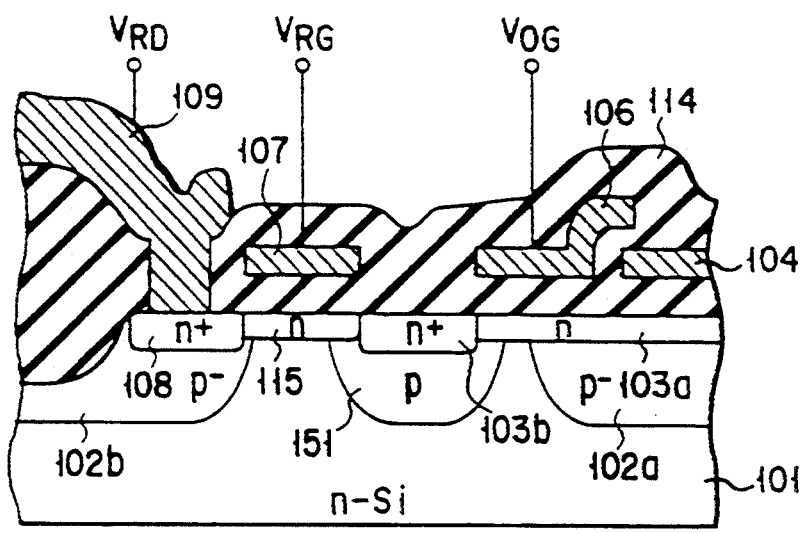
FIG. 9 is an enlarged sectional view of the charge-sensing section in a charge-transfer device according to still another embodiment of the present invention.

FIG. 9 is an enlarged sectional view of the charge-sensing section in a charge-transfer device according to still another embodiment of the present invention. This embodiment has the same configuration as the embodiment shown in FIGS. 1A to 1C and FIG. 2A except that a p-well is divided and a p-channel layer 151 of the charge-sensing PMOS transistor is formed in a different position.

In this embodiment, the high-resistance p$^-$-well layer (an impurity concentration of $1 \times 10^{12}$ to $1 \times 10^{17}$ cm$^{-3}$) is divided into a first portion 102a located under the charge-transfer n-channel layer 103a and a second portion 102b located under the charge release n+-type drain layer. Between the portions 102a, 102b of the well layer, a charge-sensing p-channel layer 151 (an impurity concentration of $1 \times 10^{14}$ to $1 \times 10^{18}$ cm$^{-3}$) is formed so as to be surrounded by the n-type regions without being in contact with these portions. The both ends of the p-channel layer 151 are in contact with the charge-transfer n-channel layer 103a and the charge release n-channel layer 115. The charge storage n+-channel layer 103b is formed at the surface of the charge-sensing p-channel layer 151. The entire top surface of the layer 103b is in contact with the insulating film 121.

The potential of the charge storage channel layer 103b without charges is set so as to be higher than the potential of the charge release drain layer 108, as explained in the embodiment of FIG. 6A. Namely, the present embodiment is operated in the incomplete transfer mode. The states at that time are basically the same as those shown in FIGS. 6B to 6D.

The embodiment of FIG. 9 has the advantage that the p-channel layer 151 is easier to form than the p-channel layer 141 of FIG. 8. Because a control gate and floating gate for helping release the signal charges can be eliminated, this not only simplifies the configuration of the device and its manufacturing processes, but also requires no high-voltage power supply for the control gate.

FIG. 10 is a schematic diagram of the charge-sensing section in a charge-transfer device according to still another embodiment of the present invention. Unlike the embodiments in FIGS. 1 to 9, this embodiment relates to an improvement in the FDA charge-sensing section.

At the surface of a semiconductor substrate 210, an FD layer 211 and a reset drain 212 are formed. Placed above the semiconductor substrate 210 are a CCD transfer electrode 213, an output gate electrode 214, and a reset gate electrode 215, with an SiO$_2$ film 230 underlying these electrodes. The FD layer 211 is electrically connected to the gate electrode of a transistor 221. The source of the transistor 221 is connected to the drain of a depletion-mode load MOS transistor 222, thus forming a first-stage source follower circuit. The source of the transistor 221 is also connected to the gate electrode of an output-stage transistor 223. The source of the transistor 223 is connected to the drain of a load transistor 224, thus forming an output-stage source follower circuit. The gate electrodes 226, 225 of the load MOS transistors 224, 222 are designed to be applied with control signals V$_{cont}$ and V$_G$, respectively.

The operating point of the output-stage source follower circuit will be explained. It is assumed that the voltage of control signal V$_G$ is constant (e.g., 0 V or 1 to 2 V) and the power supply voltage V$_{DD}$ is 15 V, for example.

FIG. 11 shows the operating point of the output-stage source follower circuit. Curve 231 indicates the drain current characteristic with respect to the output voltage of the output-stage driving transistor 223 of FIG. 10. Curves 234a, 234b represent the drain current characteristics with respect to the output voltage of the output-stage load transistor 224 of FIG. 10. Curve 234a corresponds to a case where the voltage of control signal v$_{cont}$ applied to the gate electrode 226 of the transistor 224 is made high (e.g., 5 to 6 V), and curve 234b corresponds to a case where the voltage of control signal v$_{cont}$ is made low (e.g., 2 to 3 V). As seen from the figure, with this embodiment, applying a low voltage to the gate electrode 226 of the transistor 224 enables the source follower circuit to operate at the operating point (V$_1$, I$_1$) 232a, or applying a high voltage to the gate electrode 226 of the transistor 224 enables the source follower circuit to operate at the operating point (V$_2$, I$_2$) 232b. Namely, controlling the voltage V$_{cont}$ applied to the gate electrode 226 of the load transistor 224 enables the control of the bias current to the source follower circuit.

At this time, a variation V$_{out}$ of the output signal that changes with the input signal V$_{in}$ to the source follower circuit can be expressed as:

$$V_{out} = A_{dc} \cdot [1 - \exp(-Gm \cdot t/C)] \cdot V_{in} \tag{1}$$

where $V_{out}$, $V_{in}$, $A_{dc}$, $Gm$, $C$, and $t$ indicate the output voltage, the input voltage, the DC amplification factor, the mutual conductance, the load capacity, and time, respectively. It can be understood from the above equation that the greater the Gm, the faster the source follower circuit responds.

Gm can be expressed as:

$$Gm = (2 \cdot W/L \cdot \mu \cdot C_{ox} \cdot I_d)^{\frac{1}{2}} \tag{2}$$

where W, L, $\mu$, Cox, and Id indicate the channel width, the channel length, the mobility, the capacity per area, and the bias current, respectively.

Thus, it can be seen that the greater the Gm, the larger the bias current, and thereby the response speed of the circuit increases accordingly.

Consequently, during a period in which the input signal information varies, voltage $v_{cont}$ applied to the gate electrode 226 of the load MOS transistor 224 is raised to make Gm greater, which allows a large amount of current to flow, thereby improving the high-speed response of the FDA. In contrast, during a period in which the input signal information does not change, voltage $V_{cont}$ is decreased, which permits a small amount of current to flow, thereby reducing the drawn current to a substantially low level.

Figure 12A:
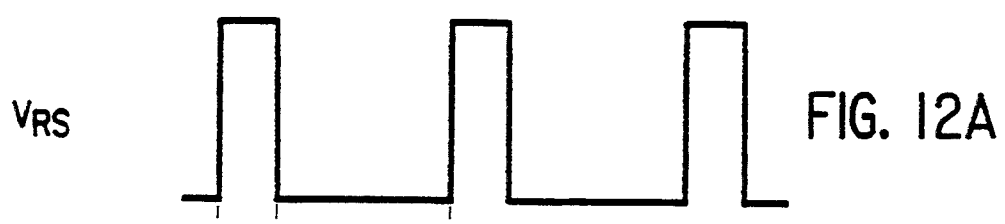
FIG. 12 is a waveform chart of the output of the FDA in the embodiment of FIG. 10.
Figure 12B:
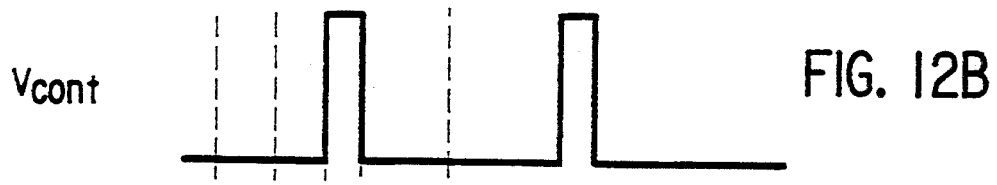
Figure 12C:
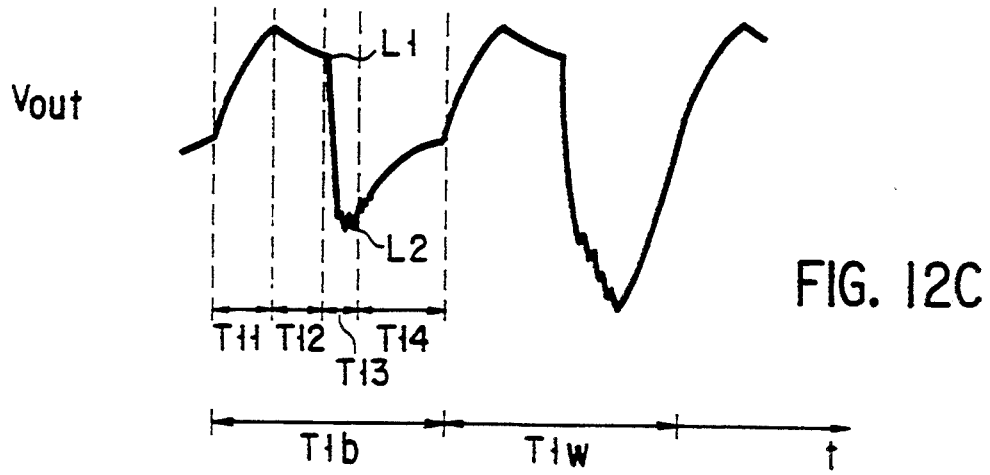

Hereinafter, using the waveform charts in FIG. 12, the above advantages will be explained in more detail. In the figure, the waveform of the voltage $V_{RS}$ at the reset gate electrode 215, the waveform of the voltage $V_{cont}$ at the gate electrode 226 of the load transistor, and the waveform of the output voltage $V_{out}$ are shown from the top in that order.

Here, T11 indicates the period in which the reset gate is in an on state, T12 the period from when the reset gate is turned off until just before the signal charges start to be injected into the FD layer 211, T13 the period in which Gm of the load transistor gate electrode 226 should be made larger, i.e., the period from just before output $V_{out}$ starts to change from feed-through level L1 to signal level L2 because of the start of charge injection until output V out fully reaches the signal level, and T14 the period from when T13 has been completed until the signal charges in the FD layer 211 start to be reset. Time T1b corresponds to a case where the signal charge is small and time T1w corresponds to a case where the signal charge is large. As in the figure, during period T13, because the Gm of the load transistor gate electrode 226 is made greater by raising voltage $V_{cont}$, the FDA responds at a high speed to the change of signal. During the periods other than period T13, because the Gm of the load transistor gate electrode 226 is made smaller by decreasing voltage $V_{cont}$, the operating current is reduced to a low level, thereby reducing noise to a very low level as compared with a conventional equivalent.

Accordingly, with the present embodiment, it is possible to reduce the power consumption and noises in the FDA of the charge-transfer device without impairing the necessary high-speed response capability. Applying a charge-transfer device with such an FDA to a solid-state imaging device enables a remarkable improvement in the performance.

Since during the periods other than T13, the FDA has a low-frequency characteristic, sampling the output signal in period T14 provides a signal containing less return noise of high-frequency noise components. In addition, low-frequency noise components can be removed from the signal by sampling the signal of period T12 and then subtracting it from the signal of period T14 or passing the signal of period T14 through a highpass filter. Furthermore, when the output signal is sampled while a small amount of current is flowing, the mutual conductance of the charge-sensing MOS transistor is low and the bandwidth is narrow, thus enabling most of high-frequency noises to be eliminated. As a result, the signal-to-noise ratio of the FDA is improved.

Accordingly, controlling the gate voltage of the load transistor in the FDA enables the bias current and noise in the FDA to be controlled, thereby improving the output sensitivity of the FDA. Application of this feature to a solid-state imaging device would improve its sensitivity remarkably.

While in the above explanation, voltage $v_G$ applied to the gate electrode 225 of the load transistor 222 in the first-stage source follower circuit is kept constant, the voltage $v_G$ may be applied to the gate electrode 225 in the form off pulse voltage. Hereinafter, the advantage of controlling voltage $v_G$ applied to the gate electrode 225 will be explained. The equivalent input noise charge generated from the thermal noise in the transistor 221 can be expressed as:

$$Q = (4k \cdot T/Gm \cdot a)^{\frac{1}{2}} \cdot Ct/[1 + (2\pi \cdot f \cdot Cgs/Gm)^2]^{\frac{1}{2}} \tag{3}$$

where Q, k, T, a, Ct, f, and Cgs indicate the equivalent input noise charge, Boltzmann's constant, the temperature, the constant in the experiment, the capacity of the FD layer 211, the noise frequency, and the capacity between the gate and source of the transistor 221, respectively.

Figure 13:
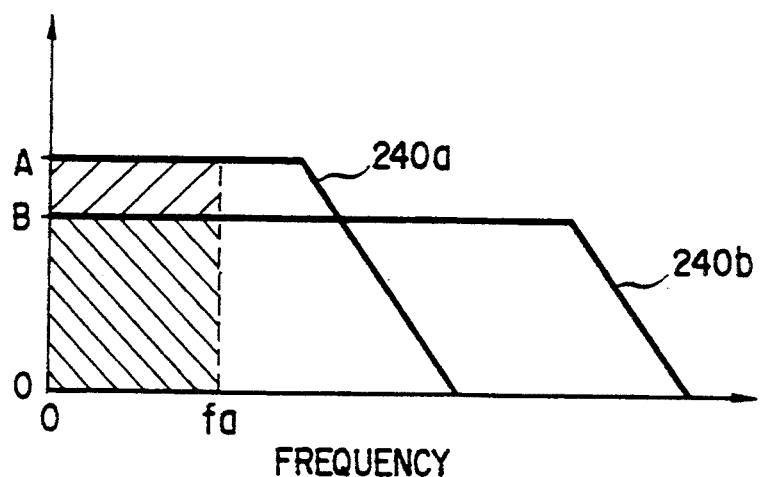
FIG. 13 is a conceptual diagram of the amount of noise obtained by further improving the FDA in the embodiment of FIG. 10.

FIG. 13 conceptually illustrates the equivalent input square noise charge obtained from the above equation with respect to frequency. It is assumed that Gm2 > Gm1. Noise 240a is noise for Gm = Gm1, and noise 240b is noise for Gm = Gm2. Noise A in DC for noise 240a is expressed as:

$$A = 4a \cdot k \cdot T \cdot Ct^2 / Gm1 \tag{4}$$

Noise B in DC for noise 240b is expressed as:

$$B = 4a \cdot k \cdot T \cdot Ct^2 / Gm2 \tag{5}$$

In the following equations, fa is the signal bandwidth determined by a later signal process. In this case, since the total noise to be outputted is the integration of noises in the bandwidth, the total noise At of noise 240a is expressed as:

$$At = (A \cdot fa)^{\frac{1}{2}} \tag{6}$$

The total noise Bt of noise 240b is expressed as:

$$Bt = (B \cdot fa)^{\frac{1}{2}} \tag{7}$$

Since At > Bt, the greater the Gm of the charge-sensing transistor 221, the smaller the noise. That is, applying a higher voltage to the gate electrode 225 of the transistor 222 further improves the effect of reducing noise. Therefore, when voltage $v_G$ is raised to make Gm of the charge-sensing transistor 221 larger only before and after the sampling of the output signal, this provides the advantage of decreasing noises contained in the output signal at the sampling without virtually increasing the power consumption.

While in the embodiment of FIG. 10, the FDA is constructed of two stages of source follower circuit, it may be composed of three or more stages of source follower circuit.

FIGS. 16 and 17 are block diagrams of cameras to which charge-transfer devices according to the embodiments of the present invention explained in FIGS. 1A to 13 are applied.

FIG. 16 shows a single plate camera 10 containing a single solid-state imaging system 12 with a built-in charge-transfer device according to an embodiment of the present invention. A solid-state imaging system 12 contains a light-receiving section 14 having a large number of pixels. The incident light from an object 5 passes through a lens 16, which concentrates it on the light-receiving section 14 of the imaging system 12. The imaging system 12 converts the signal charges generated in proportion to the concentrated light into an electric output signal in the manner as described earlier. The output signal from the imaging system 12 is transmitted to a monitor 22 by way of a signal processing circuit 18, which produces an image.

FIG. 17 shows a three-plate camera 30 containing three solid-state imaging systems with built-in charge-transfer devices according to an embodiment of the present invention. The three solid-state imaging systems have color filters of red (R), green (G), and blue (B) in their light-receiving sections respectively, and constitute a color separation optical system 32. The incident light from an object 5 passes through a lens 36, which condenses it onto the light-receiving section of each imaging system in the color separation optical system 32. Each imaging system converts the signal charges generated in proportion to the condensed light into an electric output signal in the manner as described earlier. The output signal from each imaging system is transmitted to a monitor 42 by way of signal processing circuits 38a, 38b, 38c dedicated to the individual colors and a color coder 40, which produces an image.

In the camera shown in FIG. 17, an imaging system of high sensitivity according to an embodiment of the present invention may be used only for blue (B) which is usually sensed with less sensitivity, and conventional imaging systems are used for the other colors (R, G), thereby allowing the camera to have high sensitivity to blue. In other words, an imaging system of the present invention may be selectively used for any of the colors (R, G, B), depending on uses for the camera.

Since the solid-state imaging system of the present invention features high sensitivity, it is best suited for a monitoring camera required to be used at night when the amount of signals is small. Use of a solid-state imaging system of the invention provides a high-sensitivity camera with less deterioration of the resolution.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A charge-transfer device comprising:
   a semiconductor substrate of a first conductivity type having a surface;
   a high-resistance well layer of a second conductivity type formed in said surface of said substrate;
   a charge-transfer channel layer of the first conductivity type formed in a surface of said well layer;
   a charge storage channel layer of the first conductivity type formed in said surface of said substrate so as to connect with said transfer channel layer;
   a charge release channel layer of the first conductivity type formed in said surface of said substrate so as to connect with said storage channel layer;
   a charge release drain layer of the first conductivity type formed in said surface of said substrate so as to connect with said release channel layer;
   an output gate electrode provided above the junction of said transfer channel layer and said storage channel layer, with an insulating film interposed between said output gate electrode and said junction;
   a covering insulating film formed on said substrate and corresponding to said storage channel layer;
   a reset gate electrode provided above said release channel layer, with an insulating film interposed therebetween;
   a charge-sensing channel layer of the second conductivity type of a charge-sensing transistor, formed in said substrate such that said sensing channel layer and said storage channel layer contact with each other; and
   a source and drain layers of the second conductivity type of said charge-sensing transistor, formed in said surface of said substrate so as to face each other with said sensing channel layer interposed therebetween;
   wherein said storage channel layer contains a first surface portion which adjoin said transfer channel layer and is in contact with said covering insulating film, and a second surface portion which adjoins said release channel layer and is in contact with said covering insulating film.

2. A charge-transfer device according to claim 1, wherein said storage channel layer, release channel layer, release drain layer, and sensing channel layer are formed in said well layer.

3. A charge-transfer device according to claim 2, wherein said sensing channel layer is arranged between said storage channel layer and said covering insulating film, and is arranged so as to be in contact with neither said transfer channel layer nor said release channel layer.

4. A charge-transfer device according to claim 2, wherein said storage channel layer is arranged between said sensing channel layer and said covering insulating film, and said sensing channel layer is arranged so as to be in contact with neither said transfer channel layer nor said release channel layer.

5. A charge-transfer device according to claim 1, wherein said storage channel layer is arranged between said sensing channel layer and said covering insulating film and said sensing channel layer is arranged so as to be in contact with both said transfer channel layer and said release channel layer.

6. A charge-transfer device according to claim 1, wherein the potential of said storage channel layer without charges is set higher than that of said release drain layer.

7. A charge-transfer device according to claim 6, wherein the potential inequality between said storage channel layer and said release drain layer is set by adjusting the impurity concentration in said storage channel layer.

8. A charge-transfer device according to claim 1, wherein a control gate electrode is provided above said storage channel layer, with said covering insulating film interposed therebetween.

9. A charge-transfer device comprising:
a semiconductor substrate of a first conductivity type having a surface;
a high resistance well layer of a second conductivity type formed in said surface of said substrate;
a charge-transfer channel layer of the first conductivity type formed in a surface of said well layer;
a charge storage channel layer of the first conductivity type formed in said surface of said well layer so as to connect with said transfer channel layer;
a charge release channel layer of the first conductivity type formed in said surface of said well layer so as to connect with said storage channel layer;
a charge release drain layer of the first conductivity type formed in said surface of said well layer so as to connect with said release channel layer;
an output gate electrode provided above the junction of said transfer channel layer and said storage channel layer, with an insulating film interposed between said output gate electrode and said junction;
a covering insulating film formed on said substrate and corresponding to said storage channel layer;
a reset gate electrode provided above said release channel layer, with an insulating film interposed there between;
a charge-sensing channel layer of the second conductivity type of a charge-sensing transistor, arranged between said storage channel layer and said covering insulating film, said sensing channel layer being arranged so as to be in contact with neither said transfer channel layer nor said release channel layer, and said storage channel layer containing a first surface portion which adjoins said transfer channel layer and is in contact with said covering insulating film, and a second surface portion which adjoins said release channel layer and is in contact with said covering insulating film; and
a source and drain layers of the second conductivity type of said charge-sensing transistor, formed in said surface of said substrate so as to face each other with said sensing channel interposed therebetween.

10. A charge-transfer device according to claim 9, wherein the potential of said storage channel layer without charges is set higher than that of said release drain layer.

11. A charge-transfer device according to claim 10, wherein the potential inequality between said storage channel layer and said release drain layer is set by adjusting the impurity concentration in said storage channel layer.

12. A charge-transfer device according to claim 9, wherein a control gate electrode is provided above said storage channel layer, with said covering insulating film interposed therebetween.

13. A charge-transfer device comprising:
a semiconductor substrate of a first conductivity type having a surface;
a high-resistance well layer of a second conductivity type formed in said surface of said substrate;
a charge-transfer channel layer of the first conductivity type formed in a surface of said well layer;
a charge storage channel layer of the first conductivity type formed in said surface of said substrate so as to connect with said transfer channel layer;
a charge release channel layer of the first conductivity type formed in said surface of said substrate so as to connect with said storage channel layer;
a charge release drain layer of the first conductivity type formed in said surface of said substrate so as to connect with said release channel layer
an output gate electrode provided above the junction of said transfer channel layer and said storage channel layer, with an insulating film interposed between said output gate electrode and said junction;
a covering insulating film formed on said substrate and corresponding to said storage channel layer;
a reset gate electrode provided above said release channel layer, with an insulating film interposed therebetween;
a charge-sensing channel layer of the second conductivity type of a charge-sensing transistor, formed in said substrate such that said sensing channel layer and said storage channel layer contact each other; and
a source and drain layers of the second conductivity type of said charge-sensing transistor, formed in said surface of said substrate so as to face each other with said sensing channel layer interposed therebetween;
wherein the potential of said storage channel layer without charges is set higher than that of said release drain layer.

14. A charge-transfer device according to claim 13, wherein the potential inequality between said storage channel layer and said release drain layer is set by adjusting the impurity concentration in said storage channel layer.

15. A charge-transfer device according to claim 13, wherein the potential inequality between said storage channel layer and said release drain layer is set by adjusting the potential of said release drain layer.

16. A charge-transfer device according to claim 13, wherein said storage channel layer contains a first surface portion which adjoins said transfer channel layer and is in contact with said covering insulating film, and a second surface portion which adjoins said release channel layer and is in contact with said covering insulating film.

17. A charge-transfer device according to claim 13, wherein said storage channel layer, release channel layer, release drain layer, and sensing channel layer are formed in said well layer.

18. A charge-transfer device according to claim 17, wherein said sensing channel layer is arranged between said storage channel layer and said covering insulating film and is arranged so as to be in contact with neither said transfer channel layer nor said release channel layer.

19. A charge-transfer device according to claim 17, wherein said storage channel layer is arranged between said sensing channel layer and said covering insulating film, and said sensing channel layer is arranged so as to be in contact with neither said transfer channel layer nor said release channel layer.

20. A charge-transfer device according to claim 13, wherein said storage channel layer is arranged between said sensing channel layer and said covering insulating film, and said sensing channel layer is arranged so as to be in contact with both said transfer channel layer and said release channel layer.

* * * * *